US012431885B2

United States Patent
Cisse et al.

(10) Patent No.: US 12,431,885 B2
(45) Date of Patent: Sep. 30, 2025

(54) CIRCUIT AND METHOD FOR CONTROLLING A TRANSISTOR

(71) Applicant: STMicroelectronics (Tours) SAS, Tours (FR)

(72) Inventors: Diawoye Cisse, Tours (FR); Bertrand Rivet, Vouvray (FR); Frederic Gautier, Monnaie (FR)

(73) Assignee: STMicroelectronics (Tours) SAS, Tours (FR)

( * ) Notice: Subject to any disclaimer, the term of this patent is extended or adjusted under 35 U.S.C. 154(b) by 147 days.

(21) Appl. No.: 18/371,622

(22) Filed: Sep. 22, 2023

(65) Prior Publication Data

US 2024/0113704 A1   Apr. 4, 2024

(30) Foreign Application Priority Data

Sep. 30, 2022   (FR) ..................................... 2209951

(51) Int. Cl.
*H03K 17/06*   (2006.01)
*H02M 1/08*   (2006.01)
*H02M 3/156*   (2006.01)
*H02M 3/335*   (2006.01)

(52) U.S. Cl.
CPC ............ *H03K 17/063* (2013.01); *H02M 1/08* (2013.01); *H02M 3/156* (2013.01); *H02M 3/33523* (2013.01)

(58) Field of Classification Search
None
See application file for complete search history.

(56) References Cited

U.S. PATENT DOCUMENTS

| | | | | |
|---|---|---|---|---|
| 7,835,188 B2 * | 11/2010 | Satou | ..................... | G11C 29/50 365/201 |
| 8,519,691 B2 * | 8/2013 | McCloy-Stevens | ......................... | H02M 3/1588 323/287 |
| 11,152,846 B2 * | 10/2021 | Matei | ..................... | H02M 3/156 |
| 11,689,095 B2 * | 6/2023 | Liu | ..................... | H02M 1/0029 363/21.13 |
| 2019/0165686 A1 | 5/2019 | Wang | | |
| 2022/0158565 A1 | 5/2022 | Chen | | |

OTHER PUBLICATIONS

INPI Search Report and Written Opinion for priority application, FR Appl. No. 2209951, report dated Mar. 23, 2023, 9 pgs.

* cited by examiner

*Primary Examiner* — Cassandra F Cox
(74) *Attorney, Agent, or Firm* — Crowe & Dunlevy LLC (57) ABSTRACT

A method for controlling a MOS transistor compares a first voltage between a drain and a source of the MOS transistor to a second controllable threshold voltage. When the first voltage is smaller than a third voltage, a fourth control voltage is applied to the MOS transistor that is greater than a fifth threshold voltage of the MOS transistor. When the first voltage is greater than the second voltage, the fourth control voltage applied to the MOS transistor is smaller than the fifth voltage. The second voltage is equal to a first constant value between a first time and a second time, and is equal to a second variable value between the second time and a third time. The second value is equal to a sum of the first voltage and a sixth positive voltage. The third time corresponds to a time when the first voltage inverts.

21 Claims, 9 Drawing Sheets

CIRCUIT AND METHOD FOR CONTROLLING A TRANSISTOR

PRIORITY CLAIM

This application claims the priority benefit of French Application for Patent No. 2209951, filed on Sep. 30, 2022, the content of which is hereby incorporated by reference in its entirety to the maximum extent allowable by law.

TECHNICAL FIELD

The present disclosure relates generally to the electronic devices and systems and, more particularly, to a circuit and method for controlling transistors such as N-channel MOS type transistors.

BACKGROUND

In the field of electronics, it is usual that some components are associated with a control circuit allowing them to be best operated.

Transistors are frequently associated with a control circuit which is configured to apply a control voltage to the transistor control terminal.

It would be preferable to be able to improve, at least in part, some aspects of the control circuits of transistors.

There is a need for more efficient control circuits of transistors.

There is a need for control circuits of transistors allowing the current leakages to be restricted during the state transitions of the transistor.

There is a need for self-powered control circuits of transistors.

There is a need to address all or some of the drawbacks of known control circuits of transistors.

SUMMARY

One embodiment provides a method for controlling an N-channel MOS transistor, comprising: comparing a first voltage between the drain and the source of said transistor with a second controllable threshold voltage; when the first voltage is smaller than a third voltage, applying a fourth control voltage between the gate and the source of said transistor that is greater than a fifth threshold voltage of said transistor; when the first voltage is greater than the second voltage, applying the fourth control voltage between the gate and the source of said transistor that is smaller than the fifth threshold voltage of said transistor; wherein said second voltage is equal to: a first constant value between a first time and a second time; and a second variable value, between the second time and a third time, the second variable value being equal to the sum of the first voltage and a sixth positive voltage, wherein the third time corresponds to a time when the first voltage inverts.

According to an embodiment, the first constant value is about 0 V.

According to an embodiment, a first duration, comprised between the first time and the second time, is a constant duration corresponding to the third of a second duration corresponding to the third of the whole duration of a conduction cycle of the transistor.

According to an embodiment: before a fourth time, comprised between the first time and the third time, applying the fourth control voltage between the gate and the source of said transistor that at a third value greater than a fifth threshold voltage of said transistor; and between the fourth time and the third time, applying the fourth control voltage between the gate and the source of said transistor that is reduced up to a fourth value.

According to an embodiment, between the fourth time and the third time, the fourth value is reached when the first voltage is equal to a seventh voltage.

According to an embodiment, the seventh voltage is equal to the multiplication of a factor by the third voltage representing the voltage level between the drain and source terminals of said transistor reached when a parasitic diode of said transistor is conductive.

According to an embodiment, said factor is comprised between one third and two third.

According to an embodiment, the fourth time is comprised between the second time and the third time.

Another embodiment provides a control circuit configured to implement the method as previously described.

A further embodiment provides an electronic device comprising a control circuit as previously described.

According to an embodiment, the device further comprises a N-channel MOS-type transistor, and a driving circuit of said transistor.

A further embodiment provides a device for converting a voltage comprising the device as previously described.

According to an embodiment, the device for converting a voltage is a transformer switched converter.

According to an embodiment, the device for converting a voltage is an up-converter.

According to an embodiment, the device for converting a voltage is a Buck type converter.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various Figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the Figures.

Unless specified otherwise, the expressions "around", "approximately", "substantially" and "in the order of" signify within 10%, and preferably within 5%.

Figure 1:
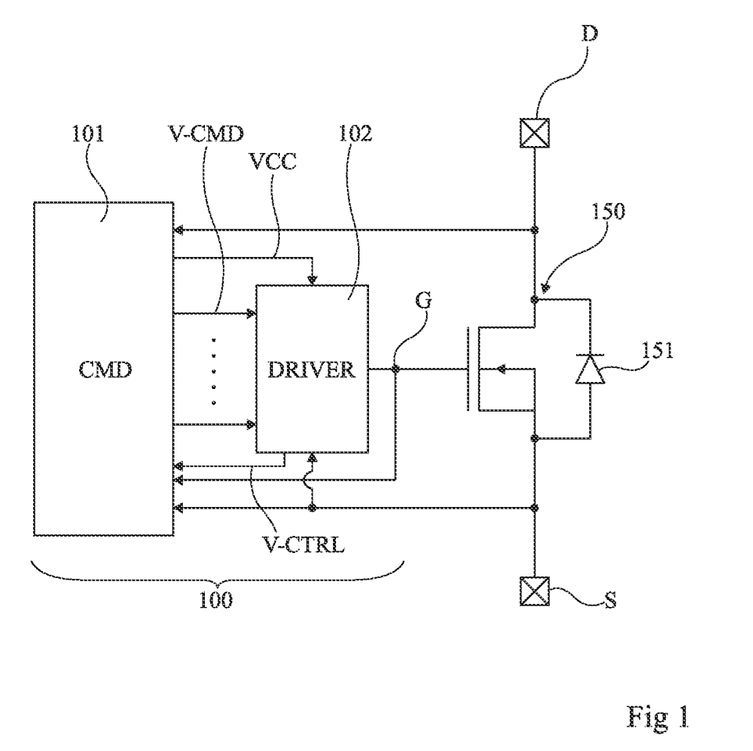
FIG. 1 illustrates, very schematically and in a block form, a general embodiment of a control circuit of a transistor.

FIG. 1 illustrates very schematically and in a block form an embodiment of an electronic device comprising a transistor 150 and its control circuit 100.

The transistor 150 is an isolated-gate field-effect transistor, or transistor of the Metal Oxide Semiconductor Field Effect Transistor (MOSFET) type, also called a MOS-type transistor. Moreover, and more precisely, the transistor 150 is an N-channel MOS-type, also called NMOS transistor. The transistor 150 comprises two conduction terminals and a control terminal. A first conduction terminal is the drain terminal of the transistor 150, and is coupled, preferably connected, to a drain node D. A second conduction terminal is the source terminal of the transistor 150, and is coupled, preferably connected, to a source node S. The control terminal of the transistor 150 is the gate terminal of the transistor 150 and is coupled, preferably connected, to a gate node G. Moreover, like any MOS-type transistor, the transistor 150 comprises a parasitic diode, illustrated in FIG. 1 by a diode 151 having its anode coupled, preferably connected, to the source node S, and having its cathode coupled, preferably connected, to the drain node D.

The control circuit 100 is a circuit coupled to the source S, drain D, and gate G nodes of the transistor 150, and allowing a control voltage of the transistor to be provided between the gate node G and the source node S. The control circuit 100 comprises a control unit 101, or control circuit 101, and a driving circuit 102. The control circuit 100 has the particularity of self-powering on the basis of the voltage received between the drain and source terminals of the transistor 150. The control circuit 100 also has the particularity of self-controlling on the basis of the voltage received between the drain and source terminals of the transistor 150.

The control unit 101 comprises logic circuits allowing several V-CMD control voltages to be provided to the driving circuit 102, and at least one supply circuit allowing a supply voltage VCC to be provided to the driving circuit 102. To this end, the control unit 101 is coupled, preferably connected, to the nodes D, S, and G of the transistor 150. The control unit can further receive one or more control voltages V-CTRL from the driving circuit 102. The control unit receives no external supply voltage.

The driving circuit 102 is a circuit configured to provide a control voltage between the nodes G and S intended for controlling the operation of the transistor 150, on the basis of the control voltages V-CMD supplied by the control unit 100.

Example applications of the transistor 150 associated with the control circuit 100 will be described in relation with FIGS. 2 and 3. Detailed examples of the control circuit 100 will be described in relation with FIGS. 4 to 10.

Figure 2:
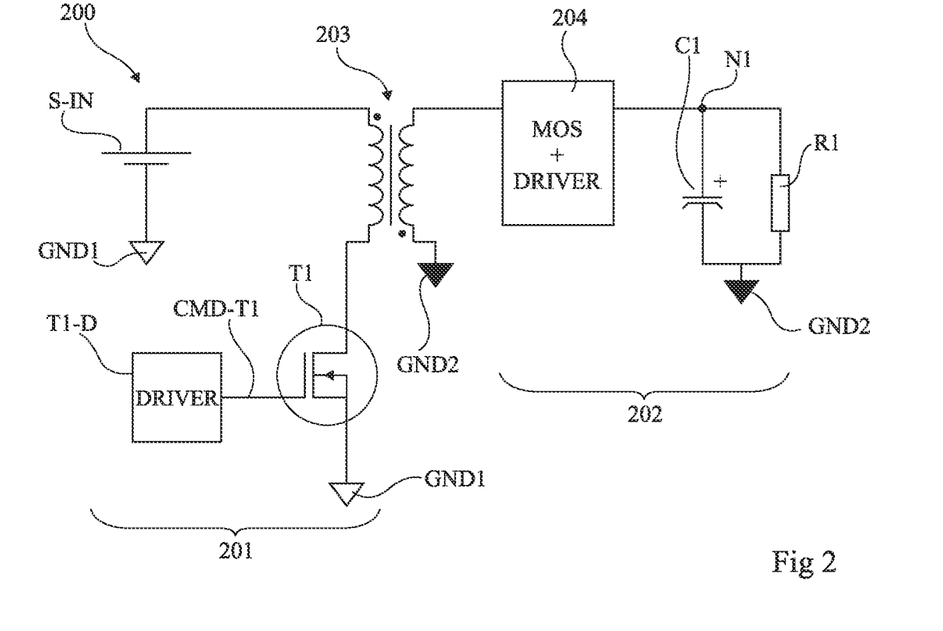
FIG. 2 illustrates, schematically and partly in a block form, an example application of the embodiment of FIG. 1.

FIG. 2 illustrates an example embodiment of the transformer switched converter circuit 200, also called flyback converter, using a device of the type described in relation with FIG. 1. In other words, the circuit 200 is a switched supply using a transformer.

The circuit 200 comprises a primary stage 201 and a secondary stage 202 spaced apart (galvanically isolated) by a transformer 203. More particularly, the transformer 203 is constituted of a first coil coupled to the primary stage 201, and a second coil coupled to the secondary stage 202.

The primary stage 201 for example comprises an input voltage source S-IN supplying an input voltage, and a N-channel MOS transistor T1 associated with a driving circuit T1-D (DRIVER). The voltage source S-IN comprises a first terminal coupled to a terminal of the first coil of the transformer 203, and a second terminal coupled, preferably connected, to a first reference node GND1 receiving a first reference potential. The transistor T1 is arranged to couple a second terminal, different from the first terminal, of the first coil of the transformer, to the first reference node GND1. More particularly, the drain of transistor T1 is coupled, preferably connected, to the second terminal of the first coil of the transformer 203, and the source of transistor T1 is coupled, preferably connected, to the first reference node GND1. The gate of transistor T1 receives a control voltage CMD_T1 from the driving circuit T1-D.

The secondary stage 202 comprises, for example, a device 204 (MOS+DRIVER) of the type of the device described in relation with FIG. 1, a capacitor C1, and a resistor R1. The device 204 comprises a first terminal, corresponding to the source terminal of the device of FIG. 1, and being coupled, preferably connected, to a first terminal of the second coil of the transformer 203. The device 204 comprises a second terminal corresponding to the drain terminal of the device of FIG. 1, and being coupled, preferably connected, to an output node N1. The capacitor C1 and the resistor R1 are arranged in parallel between the node N1 and a second reference node GND2 receiving a second reference potential different from the first reference potential. The second terminal of the second coil of the transformer 203 is further coupled, preferably connected, to the second reference node GND2. The resistor R1 reflects a load arranged at the output of the circuit 200.

The operation of the circuit 200 is the usual operation of a flyback-type converter. The circuit 200 has two states that alternate as the circuit 200 is operating.

In a first state, said ON state, the transistor T1 is conductive, the first coil of the transformer 203 is directly coupled to the input voltage source S-IN. It results in an increasing of the magnetic flux in the transformer 203. The voltage at the second coil of the transformer is negative, and the transistor of the device 204 is controlled so that it is not in the ON state. The load R1 arranged between the nodes N1 and GND2 then receives power from the capacitor C1.

In a second state, said OFF state, the transistor T1 is controlled so that it is not conductive, and the transistor of the device 204 is controlled to be conductive. The power stocked in the transformer 203 is used to charge the capacitor C1 and to supply the load R1 arranged between the nodes N1 and GND.

Thus, to operate the circuit 200, the transistor T1 and the transistor of the device 204 are oppositely controlled, generally by square-wave signals in phase opposition.

Figure 3:
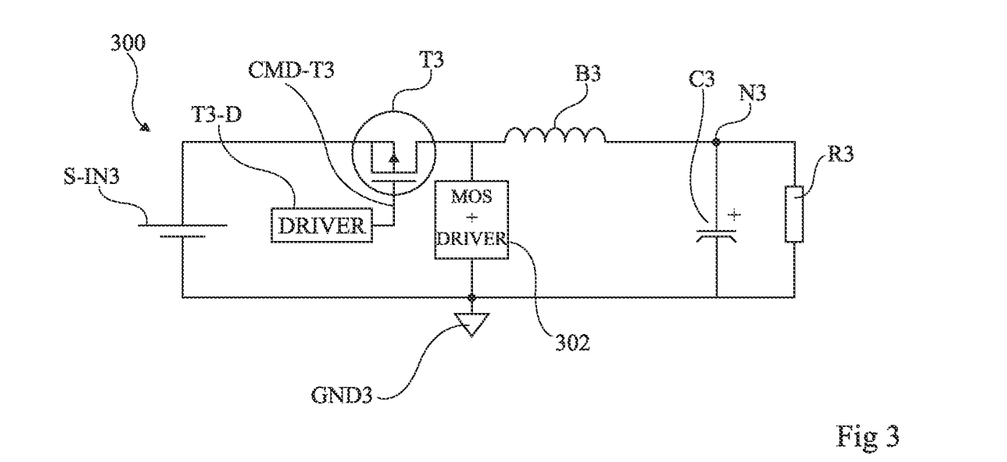
FIG. 3 illustrates, schematically and partly in a block form, another example application of the embodiment of FIG. 1.

FIG. 3 illustrates an example embodiment of a Buck converter circuit 300, that is a down-converter circuit, using a device of the type of that described in relation with FIG. 1. Generally, a Buck converter circuit is a switched supply that converts a discrete voltage into another discrete voltage having a smaller value.

The circuit 300 comprises: an input voltage source S-IN3; a P-channel MOS-type transistor T3 associated with a driving circuit T3-D (DRIVER); a device 302 (MOS+DRIVER) of the type of the device described in relation with FIG. 1; a coil B3; a capacitor C3; and a resistor R3.

The input voltage source S-IN3 is coupled between the source terminal of the transistor T3 and a reference node GND3 receiving a reference potential, for example ground. The driving circuit T3-D is configured to supply a control voltage CMD-T3 to the gate of transistor T3.

The device 302 comprises a first terminal corresponding to the drain terminal of the transistor included in the device 302, this first terminal being coupled, preferably connected, to the drain terminal of transistor T3. The device 302 further comprises a second terminal corresponding to the source terminal of the transistor included in the device 302, this second terminal being coupled, preferably connected, to the reference node GND3. Thus arranged, the device 302 constitutes a part of the secondary stage of circuit 300.

The coil B3 comprises a first terminal coupled, preferably connected, to the drain terminal of the transistor T3 and a second terminal coupled, preferably connected, to an output node N3. The capacitor C3 and the resistor R3 are arranged in parallel between the nodes N3 and GND3. The resistor R3 reflects a load arranged at the output of the circuit 200.

The operation of the circuit 300 is the usual operation of a Buck type converter. The circuit 200 presents two states that alternate each other when the circuit 200 is operating.

In a first state, said ON state, the transistor T3 is conductive, the coil B3 is directly coupled to the input voltage source S-IN. It results in an increasing of the magnetic flux in the coil B3. The voltage at the device 302 is negative, and the transistor of the device 302 is controlled so that it is not ON. The load R3 arranged between the nodes N3 and GND3 then receives power from the capacitor C3.

In a second state, said OFF state, the transistor T3 is controlled so that it is not conductive, and the transistor of the device 302 is controlled so that it is conductive. The power stocked in the coil B3 is transferred to charge the capacitor C1 and to supply the load R3 arranged between nodes N3 and GND3.

Thus, to operate the circuit 300, the transistor T3 and the transistor of the device 302 are controlled in opposition, generally by square-wave signals in phase opposition.

Figure 4:
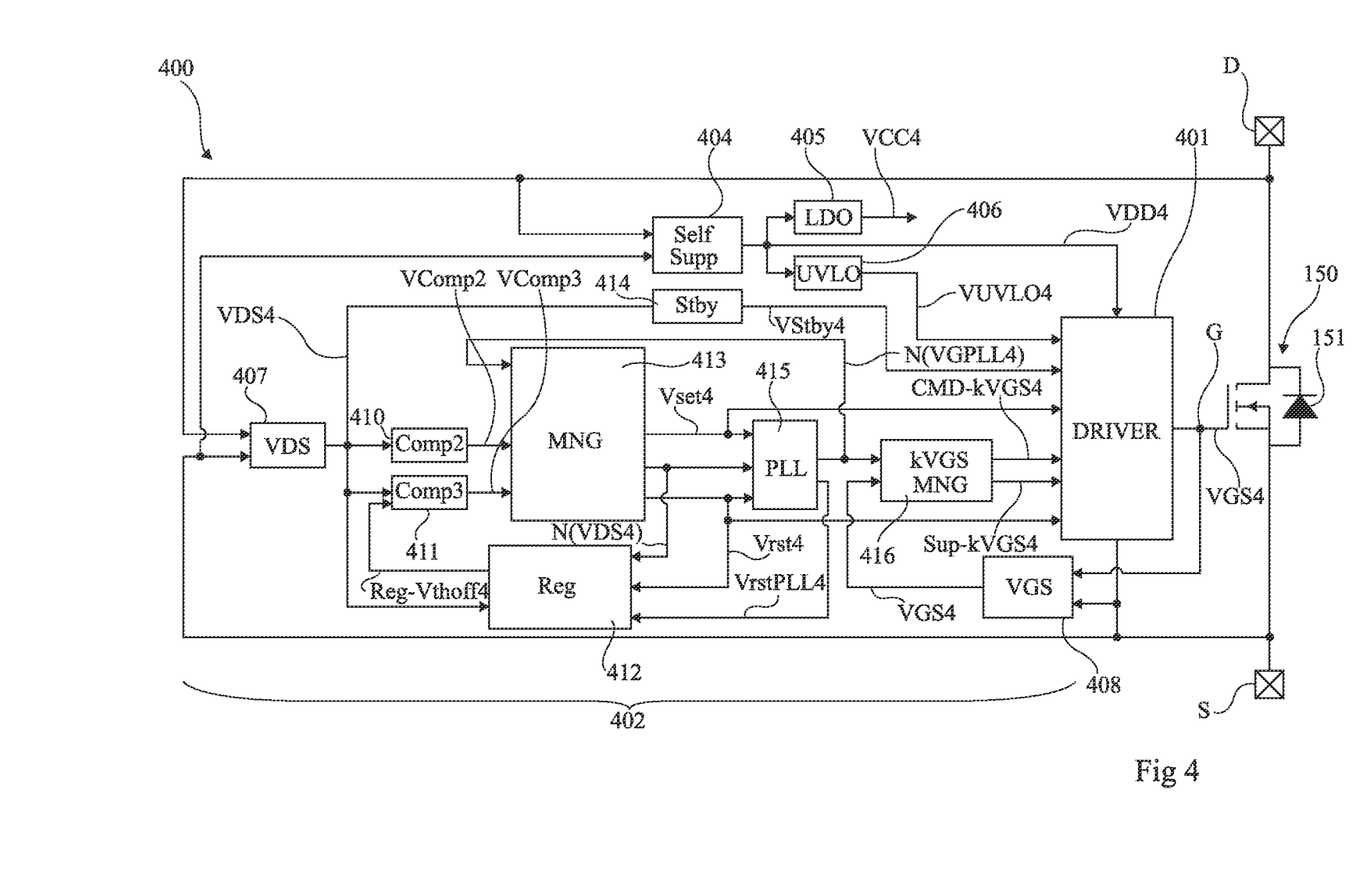
FIG. 4 illustrates, schematically and partly in a block form, a more detailed first embodiment of a control circuit of a transistor.

FIG. 4 illustrates more finely and in a block form a first embodiment of a device of the type of the device of FIG. 1. More particularly, FIG. 4 illustrates a first embodiment of an electronic device comprising the transistor 150 and its control circuit 400 of the type of the control circuit 100 described in relation with FIG. 1.

The control circuit 400 comprises, like the control circuit 100 of FIG. 1, a driving circuit 401 (DRIVER) supplying a control voltage VGS4 to the transistor 150. To this end, the driving circuit 401 is coupled, preferably connected, to the terminals G and S of transistor 150. Moreover, the driving circuit 401 receives a supply voltage VDD4, and several control voltage hereinafter detailed.

The control circuit 400 further comprises other circuits all constituting parts of a control unit 402 of the type of the control unit 101 described in relation with FIG. 1.

The control unit 402 comprises supply circuits delivering the supply voltage VDD4 from the voltage present between the drain D and source S terminals of the transistor 150. The supply circuits comprise, for example: a self-supply circuit 404 (Self Supp); a voltage regulator 405 (LDO) (Liner and Low Drop Out circuit); an under-voltage lock out circuit 406 (UVLO).

The self-supply circuit 404 comprises two inputs coupled, preferably connected, to the terminals D and S, and an output supplying the supply voltage VDD4. The voltage regulator 405 receives, as an input, the supply voltage VDD4, and delivers, as an output, a supply voltage VCC4 having a magnitude smaller than the supply voltage VDD4; this supply voltage VCC4 is used, for example, in supplying the different circuits of the control unit 402, and also in supplying the driving circuit 401. The under-voltage lockout circuit 406 further receives, as an input, the supply voltage VDD4 and delivers, as an output, a control voltage VUVLO. The control voltage VUVLO is sent to the driving circuit 401, and allows the same to be indicated whether the supply voltage VDD4 becomes too low to supply the same. According to an example, if the supply voltage VDD4 becomes smaller than a threshold voltage, the control voltage VUVLO then changes its state, and the driving circuit 401 can take it into account, in order to cause, for example, the transistor 150 to become non-conductive, and thus let the parasitic diode 151 becoming conductive.

The control unit 402 further comprises circuits for measuring a voltage, among which: a measurement circuit 407 (VDS) for measuring the drain-source voltage of the transistor 150 coupled, preferably connected, to the D and S terminals of the transistor 150, and supplying, as an output, a voltage VDS4 representative of the drain-source voltage of the transistor 150; and a measurement circuit 408 for measuring the gate-source voltage of the transistor 150 coupled, preferably connected, to the G and S terminals of the transistor 150, and supplying, as an output, a voltage VGS4 representative of the gate-source voltage of the transistor 150.

The control unit 402 further comprises voltage comparison circuits 410 (Comp2) and 411 (Comp3), or circuits for detecting a threshold by comparison 410 and 411.

The comparison circuit 410 receives, as an input, the voltage VDS4, and delivers, as an output, a comparison voltage VComp2. The comparison circuit 410 is configured to compare the value of the magnitude of the voltage VDS4 with a threshold voltage VTHON4 representing the voltage level between the D and S terminals of the transistor 150 reaches when the parasitic diode 151 of the transistor 150 becomes conductive. This phenomenon occurs when a control voltage intending to render the transistor 150 non-conductive is forced at the gate, but the voltage measured between its drain and source terminals is too high in absolute value, due to the conduction of the parasitic diode 151.

The comparison circuit 411 receives, as an input, the voltage VDS4, and delivers, as an output, a comparison voltage Vcomp1. The comparison circuit 411 is configured to compare the value of the magnitude of the voltage VDS4 with a voltage Reg_Vthoff4 allowing the time at which the drain-source voltage of the transistor 150 inverts to be determined. The function of the voltage Reg_Vthoff4 will be described in a more detailed manner in relation with FIG. 5.

The control unit 402 further comprises according to an embodiment, a generation circuit 412 for generating the voltage Reg_Vthoff4, receiving, as an input, the following voltages: the voltage VDS4; a voltage N(VDS4) representing the conduction state of the transistor 150, more particularly when the transistor is conductive, the voltage N(VDS4) is at a high state, and when the transistor is non-conductive, the voltage N(VDS4) is at a low state; a reset voltage Vrst4; and a reset voltage VrstPLL4 of a further circuit of the control unit 402.

Figure 6:
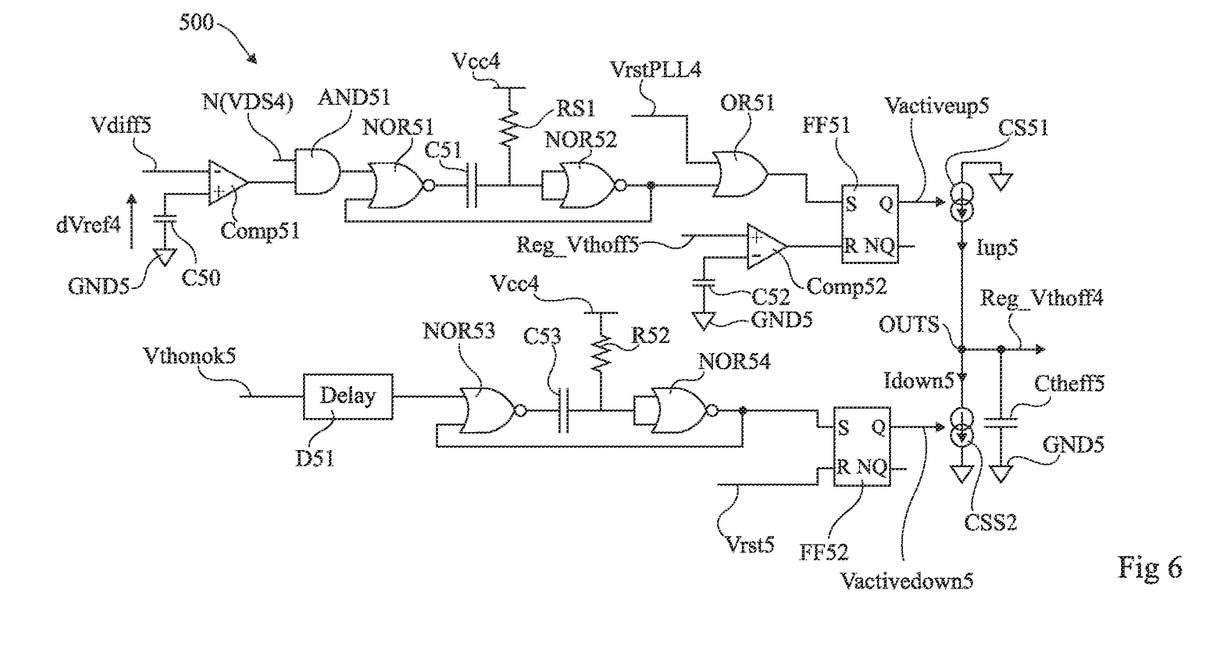
FIG. 6 schematically illustrates an example implementation of a part of the embodiment of FIG. 4.

An example embodiment of the generating circuit 412 is described in relation with FIG. 6.

The control unit 402 further comprises a management circuit 413 (MNG) for managing the states of the transistor 150. The management circuit 413 receives, as an input, the comparison voltages VComp2 and VComp 3, and an output voltage N(VGPLL4) of a further circuit of the control unit 402. The management circuit 413 delivers, as an output, the voltages N(VDS4) and Vrst4, and a control voltage Vset4. The control voltage Vset4 has the function of sending to the driving circuit 401 the command for the transistor 150 to conduct, and thus of initiating a conduction cycle of the transistor 150. The control voltage Vrst4 has a function to send to the driving circuit 401 the command for the transistor 150 to open, that is the command to stop the conduction of transistor 150, and thus the command allowing a conduction cycle of the transistor 150 to be interrupted.

The control unit 402 further comprises a standby circuit 414 receiving, as an input, the voltage VDS4, and delivering, as an output, a standby voltage VStby4 sent to the driving circuit 401.

The control unit 402 further comprises a time period regulation circuit 415 (phase lock loop—PLL) allowing the regulation of a delay tdn4 according to a reference duration tdoff4. The circuit 415 receives, as an input, the voltages Vset4, N(VDS4) and the reset voltage Vrst4, and delivers, as an output, the voltages N(VGPLL4) and VrstPLL4.

The control unit 402 further and lastly comprises a management circuit 416 (kVGS MNG) of the level of the control voltage applied to the gate of the transistor 150. The management circuit 416 is in option in this embodiment. The management circuit 416 receives, as an input, the voltage N(VGPLL4) and the voltage VGS4, and delivers, as an output, a control voltage CMD_kVGS4 at the level of the control voltage of the transistor 150. The management circuit 416 further and optionally can deliver a control voltage Sup_kVGS4 indicating that the control voltage of the transistor 150 reached the set threshold.

Figure 5:
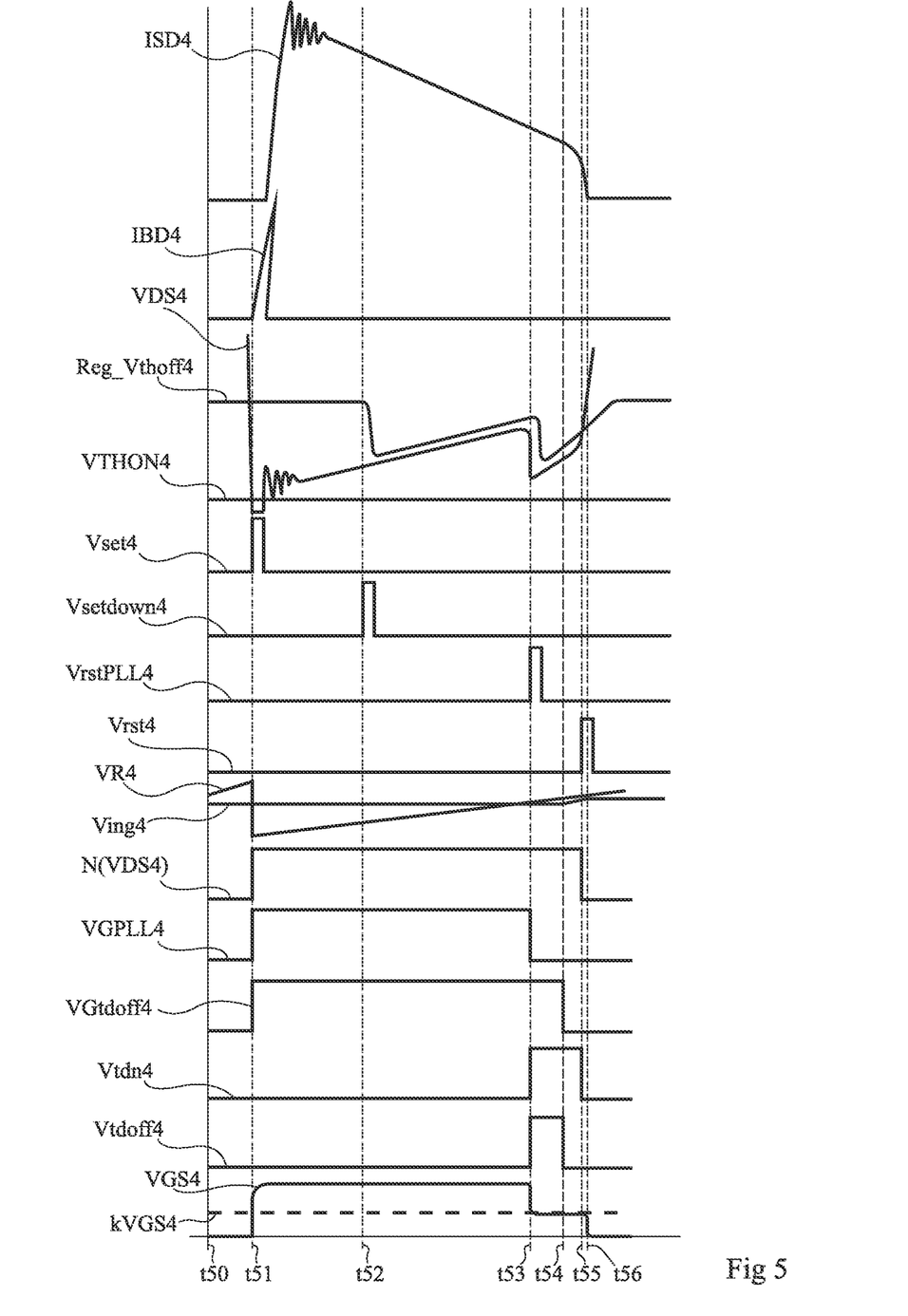
FIG. 5 illustrates timing diagrams representing the operation of the embodiment of FIG. 4.

FIG. 5 illustrates timing diagrams representing the operation of the embodiment described in relation with FIG. 4 when it is used in a voltage-conversion circuit of the type of the circuits described in relation with FIGS. 2 and 3. The device of FIG. 4 is more particularly used as a transistor in the secondary stage of these voltage-conversion circuits.

More particularly, FIG. 5 illustrates the following timing diagrams: the timing diagram of a current ISD4 representing the current flowing through the transistor 150, that is the current between the nodes S and D; the timing diagram of a current IBD4 representing the current flowing through the parasitic diode 151 of the transistor 150; the timing diagram of the voltage VDS4 between the drain and source terminals of the transistor 150; the timing diagram of the threshold voltage Reg_Vthoff4 against which the voltage VDS4 is compared; the timing diagram of the threshold voltage VTHON4 corresponding to a threshold level forced at the conduction terminals of transistor 150 from which the parasitic diode 151 of the transistor 150 is considered as being conductive; the timing diagram of the control voltage Vset4 to render the transistor 150 conductive; the timing diagram of the control voltage Vsetdown4 internal to the circuit 412; the timing diagram of the reset voltage VrstPLL4 of the circuit 415; the timing diagram of the control voltage Vrst4 for interrupting the conduction of transistor 150; the timing diagram of a voltage VR5 internal to the circuit 415; the timing diagram of a control voltage Ving4 internal to the circuit 415; the timing diagram of the voltage N(VDS4) representing the conductivity state of transistor 150; the timing diagram of the voltage VGPLL4 corresponding to the inverse of the voltage N(VGPLL4); the timing diagram of a control voltage VGtdoff4 internal to the circuit 415; the timing diagram of a control voltage Vtdn4 internal to the circuit 415 representing the time period tdn4; the timing diagram of a control voltage Vtdoff4 internal to the circuit 415 representing the time period tdoff4; the timing diagram of the control voltage VGS4 of the transistor 150; and the timing diagram of a voltage kVGS4 of the management circuit 416.

At an initial time t50, the transistor 150 is controlled so that it is non-conductive. In other words, the voltage VGS4 is in a low level (i.e., in a state, or in a level, lower than the threshold voltage Vth of the transistor 150). The currents ISD4 and IBD4 flowing through the transistor 150 and its parasitic diode 151 are thus about zero, for example null, and the voltage VDS4 between the conduction terminals of the transistor 150 is a function of the circuit in which the transistor 150 is arranged.

At the initial time 150, most of the control voltages are in a low state. More particularly, the voltages Vset4, Vsetdown4, VrstPLL4, Vrst4, VGPLL4, VGTdoff4, Vtdoff4 are in a low state. The voltages VTHON4 and kVGS4 are constant threshold voltages, for example higher than zero. The threshold voltage Reg_Vthoff4 is in a constant state, for example around 0 V. The controllable threshold voltage Ving4 is at a value higher than zero. The voltage VR4 is a ramp voltage used by the regulation circuit 415, and is, for example, a value higher than zero in the initial state.

At a time t51, following the time t50, a conduction cycle of the transistor 150 starts. In other words, at time t51, a conduction command, via voltage Vset4, is sent to the driving circuit 401 so that it renders the transistor 150 conductive. To this end, the driving circuit increases the voltage VGS4 up to a first value greater than the threshold voltage Vth of transistor 150. Thus, the voltage VDS4 and the current ISD4 have their absolute values increasing, and present a few swings before stabilizing as a decreasing ramp, in absolute value, towards the zero value.

In addition, as a conduction cycle of the transistor 150 starts, the voltages N(VDS4), VGPLL4, and VGtdoff4 goes to a high state. The voltage VR4 goes to a low state, for example to zero, and becomes smaller than the voltage Ving4.

At a time t52, following the time t51, it is considered that the swings of the voltage VDS4 and of the current ISD4 are finished, and the matching of the controllable threshold voltage Reg_Vthoff4 can start. According to an example, the duration comprised between the times t51 and t52 is a time period set at the manufacturing of the device of the embodiment of FIG. 4. According to an example, this time period is equal to at least one third of the minimum duration of a conduction cycle of the transistor 150. When the control circuit 400 and the transistor 150 are used in one of the applications of FIG. 1 or 2, the duration of a conduction cycle is generally set by a switching frequency.

Thus, at time t52, the voltage Vsetdown4 indicates that the matching of the controllable threshold voltage Reg_Vthoff4 may start. The other control voltages are unchanged, and the voltage VR4 is still smaller than the voltage Ving4.

The matching of the controllable threshold voltage Reg_Vthoff4 consists in forcing, by regulating, a constant voltage offset dVref4, also called voltage dVref4, between the voltage Reg_Vthoff4 and the voltage VDS4 during the whole conduction cycle of the transistor 150, that is up to the time when the voltage Vrst4 indicates the end of the conduction cycle. According to an example, the value of the offset dVref4 is comprised between 1 and 50 mV, for example about 10 mV. A circuit allowing generating the voltage Reg_Vthoff4 is described in relation with FIG. 6.

At a time t53, following the time t52, the voltage VR4 exceeds the value of the threshold voltage Ving4, and the circuit 415 is reset via the voltage VrstPLL4 that goes to a high state during a short duration. As an example, the circuit 415 can include a comparator circuit having as inputs the voltages VR4 and Ving4 and supplying as an output the voltage VrstPLL4. According to an example, this reset may also result from a modification of the state of the voltage VrstPLL4. A method allowing the value of the voltage Ving4 to be refined is then launched. The voltages Vtdn4 and Vtdoff4 go to a high state.

In addition, at time t53, an option function implemented by the circuit 416, begins to be performed. This function allows the control voltage CMD-kVGS54 to be sent to the driving circuit allowing a matching of the level of the control voltage VGS4 when approaching the end of the conduction cycle of the transistor 150 and during the time period tdn4 previously defined. To this end, from time t53, the voltage VGS4 is lowered up to the value kVGS4 which is comprised between the threshold voltage Vth of the transistor 150 and the preceding value of the voltage VGS4, that can be called high value VGS4max of the voltage VGS4.

At a time t54, following time t53, the voltages Vtdoff4 and VGtdoff4 go to a low state. The duration between times t53 and t54 represents a reference duration during which it is permissible that the parasitic diode 151 is conductive.

At a time t55, the voltage Vtdn4 goes to a low state following the voltage Vrst4 going to the high state. If time t55 follows time t54, the value of the threshold voltage Ving4 is then increased, and if time t55 predates time t54, the value of the threshold voltage Ving4 is then decreased.

In addition, at time t55, the voltage VDS4 between the D and S terminals of the transistor 150 begins to invert and becomes greater than the threshold voltage Reg_Vthoff4. This means that the conduction cycle of transistor 150 is completed. The voltage Vrst4 then shortly goes to a high state to notify the end of the conduction cycle, and the control voltage VGS4 is decreased so that it is smaller than the threshold voltage Vth of the transistor 150. The voltage N(VDS4) then goes to a low state.

At a time t56, following time t55, the conduction cycle is completed and the voltage VDS4 changes its sign, becomes positive in the case in FIG. 5. If the voltage Reg_Vthoff4 has remained constant, at a value near 0 V, for example about 0 V, then the end of the conduction cycle would have been detected only at the time t56 and not at the time t55.

An advantage of this embodiment is that it allows a current overconsumption to be avoided at the end of the conduction cycle of the transistor 150. Indeed, the end of the conduction cycle is indicated by the time when the voltage VDS4 begins inverting. As soon as this voltage VDS4 inverts, the parasitic diode 151 of transistor 150 is non-conductive but can induce a current consumption due to its breakdown voltage, which can also be called current leakage. By detecting this inversion as soon as possible, the current consumption can be reduced.

FIG. 6 illustrates a circuit 500 representing an example embodiment of the circuit 412 described in relation with FIG. 4.

As described in relation with FIG. 4, the circuit 500 receives, as an input, voltages VDS4, N(VDS4), and VrstPLL4, and delivers, as an output, the threshold voltage reg_Vthoff4. In addition, the circuit 500 receives the supply voltage VCC4.

The circuit 500 comprises a first branch delivering a first internal control voltage Vactiveup5. The first branch receives: a voltage Vdiff5 corresponding to the difference between the voltage VDS4, measured at the drain and source terminals of the transistor 150, and the voltage Reg_Vthoff4; the constant voltage dVref4; the voltage N(VDS4); the reset voltage VrstPLL4; and the supply voltage VCC4.

The first branch comprises a capacitor C50 and a comparator circuit Comp51 receiving at its inverting input the voltage Vdiff5, and at its non-inverting input the voltage dVref4. The capacitor C50 couples the non-inverting input of the comparator circuit Comp51 to a reference node GND receiving a reference potential, for example the ground. The value of the capacitance of the capacitor C50 allows the value of the voltage dVref4 to be set.

The first branch further comprises a logic gate AND51 of the AND type, also called AND gate AND51. A first input of the AND gate AND51 receives the voltage N(VD51), and a second input of the AND gate AND51 receives the output of the comparator circuit Comp51.

The first branch further comprises a first logic gate NOR51 of the NOR type, or NOR gate NOR51, a capacitor C51, a resistor R51, and a second NOR gate NOR52. The NOR gate NOR51 comprises a first input receiving the output of the AND gate AND51, and a second input receiving the output of the NOR gate NOR52. The capacitor C51 couples the output of the NOR gate NOR51 to the two inputs of the NOR gate NOR52. The resistor R51 couples a node receiving the supply voltage VCC4 to the inputs of the NOR gate NOR52. These components allow a voltage pulse generator to be formed. Those skilled in the art will know how to instead use another type of voltage pulse generator.

The first branch further and lastly comprises a logic gate OR51 of the OR type, also called OR gate OR51, a comparator circuit Comp52, and a flip-flop FF51. A first input of the OR gate OR51 receives the reset voltage VrstPLL4, and a second input of the OR gate OR51 receives the output of the NOR gate NOR52. The non-inverting input of the comparator circuit Comp52 receives a voltage RegVthoff5 the value thereof corresponds to the threshold value taken by the voltage Reg_Thoff4 at the beginning of the conduction cycle of the transistor 150 as described in relation with FIG. 5. The inverting input of the comparator circuit Comp52 is coupled to the reference node GND5 via the capacitor C52. The value of the capacitance of the capacitor C52 allows the setting of the value of a reference voltage Vref_Vthoff5 applied to the inverting input of the comparator circuit Comp52 corresponding to the constant value taken by the voltage Reg_Vthoff4 at the beginning of the conduction cycle as described in relation with FIG. 5. The flip-flop FF51 comprises a control input S, a reset input R, a non-inverting output Q, and an inverting output NQ. The output of the OR gate OR51 is coupled to the control input S of the flip-flop FF51, and the output of the comparator circuit Comp52 is coupled to the control input S of the flip-flop FF51, and the output of the comparator circuit Comp52 is coupled to the reset input R of the flip-flop FF51. The non-inverting output of the flip-flop FF51 delivers the control voltage Vactiveup5.

The circuit 500 further comprises a second branch delivering a second internal control voltage Vactivedown5. The second branch receives the voltage VCC4 and the voltage Vrst5.

The second branch comprises a circuit D51 for adding a time period, or delay, allowing the duration between the times t51 and t52 to be set. The circuit D51 receives, as an input, an internal control signal Vthonok5, corresponding to the voltage Vset4 described in relation with FIGS. 4 and 5, intended to be delayed to obtain the behavior described in relation with FIG. 5.

The second branch further comprises a first logic gate NOR53 of the NOR type, or NOR gate NOR53, a capacitor C53, a resistor R52 and a second NOR gate NOR54. The NOR gate NOR53 comprises a first input receiving the output of the circuit D51, and a second input receiving the output of the NOR gate NOR54. The capacitor C53 couples the output of the NOR gate NOR53 to the two inputs of the NOR gate NOR54. The resistor R52 couples a node receiving the supply voltage VCC4 to the inputs of the NOR gate NOR54. These components allow a voltage pulse generator to be formed. Those skilled in the art will know how to instead use another type of voltage pulse generator.

The second branch further and lastly comprises a flip-flop FF52 comprising a control input S, a reset input R, a non-inverting output Q, and an inverting output NQ. The output of the NOR gate NOR54 is coupled to the control input S of the flip-flop FF52, and the reset input R of the flip-flop FF52 receives the reset voltage Vrst4. The non-inverting output of the flip-flop FF52 delivers the control voltage Vactivedown5.

The circuit 500 further and lastly comprises two current sources CS51 and CS52 and a capacitor Cthoff5. The current source CS51 is controlled by the voltage Vactiveup5 and delivers a current Iup5 to an output node OUT5. The current source CS52 is controlled by the voltage Vactivedown5 and delivers a current Idown5 to an output node OUT5. The capacitor Cthoff5 is arranged between the output node OUT5 and the reference node GND5.

The operation of the circuit 500 is as follows. The voltage Reg_Vthoff is delivered by the discharge of the capacitor Cthoff5. The charge and discharge of the capacitor Cthoff5 are implemented by the current sources CS51 and CS52, and are thus controlled by the voltages Vactiveup5 and Vactivedown5. Between the times t51 and t52, the voltage Reg_Vthoff4 is constant. To this end, the current sources CS51 and CS52 are deactivated. The remaining time, that is at least later than the time t52, the voltage Reg_Vthoff4 is no longer constant, to this end, the current sources are activated and the currents Iup5 and Idown5 serve the voltage Vdiff5. This is the voltage Vsetdown4 that causes the activation of the current sources CS51 and CS52.

The voltage Vactiveup5 allows the voltage Reg_Vthoff4 to be set at the reference value between the times t51 and t52, and the voltage Vactivedownup5 allows the voltage Reg_Vthoff4 to be set for the rest of the conduction cycle of the transistor 150.

Figure 7:
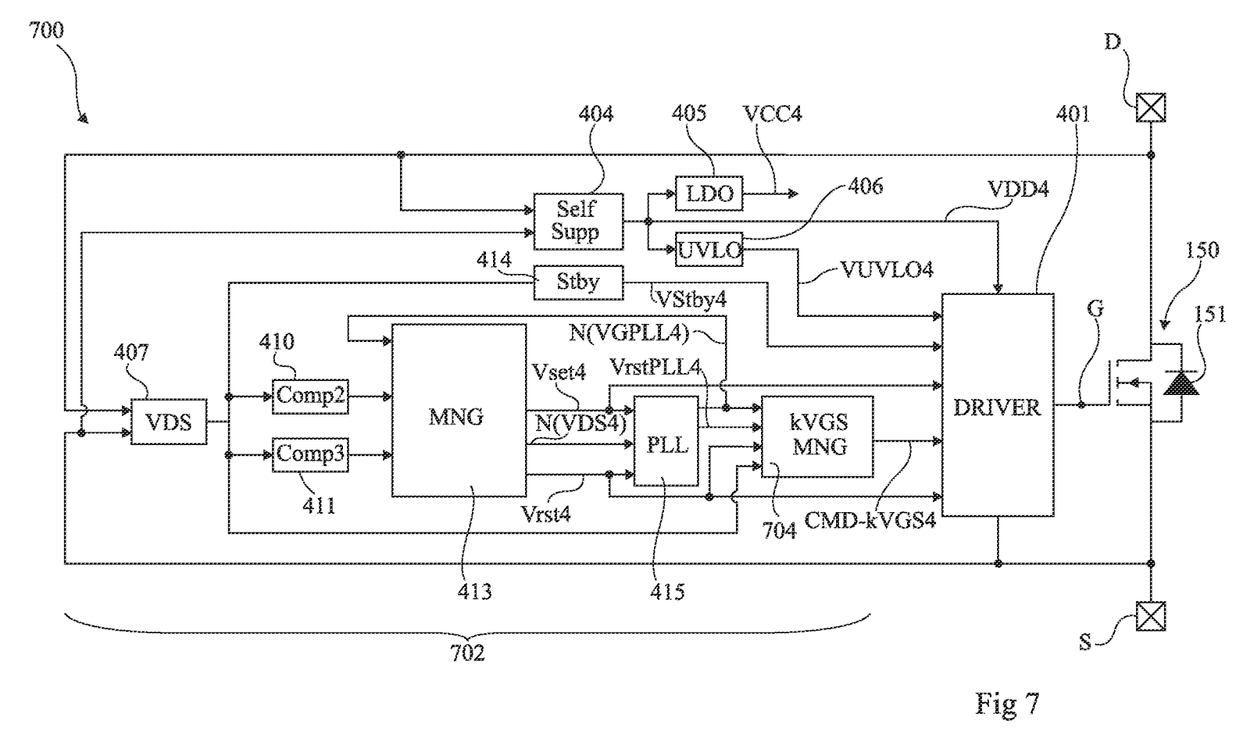
FIG. 7 illustrates, schematically and in a block form, a more detailed second embodiment of a control circuit of a transistor.

FIG. 7 illustrates, in a block form and in a finer manner, a second embodiment of a device of the type of the device of FIG. 1. More particularly, FIG. 7 illustrates a second embodiment of an electronic device comprising the transistor 150 and its control circuit 700 of the type of the control circuit 100 described in relation with FIG. 1.

The control circuit 700 presents elements common with the control circuit 400 of FIG. 4. These elements will not be described again and only the differences between the circuits 400 and 700 will be detailed.

In particular, the control circuit 700 comprises, like the control circuit 100 of FIG. 1 and the control circuit 400 of FIG. 4, a driving circuit 401 (DRIVER) delivering the control voltage VGS4 to the transistor 150. To this end, the driving circuit 401 is coupled, preferably connected, to the terminals G and S of the transistor 150. In addition, the driving circuit 401 receives a supply voltage VDD4, and several control voltages hereinafter detailed.

The control circuit 700 further comprises other circuits all constituting parts of a control unit 702 of the type of the control unit 101 described in relation with FIG. 1 or of the control unit 402 described in relation with FIG. 4.

Like the control unit 402 of FIG. 4, the control unit 702 comprises: the supply circuits constituted by the circuits 404 (Self Supp), 405 (LDO), and 406 (UVLO); the measurement circuit 407 (VDS) for measuring the drain-source voltage of the transistor 150; the comparison circuit 410 (Comp2) and a comparison circuit 411 (Comp3); the management circuit 413 (MNG); the stand-by circuit 414 (Stby); and the time period regulation circuit 415 (PLL).

Unlike the control unit 402, the control unit 702 comprises a management circuit 703 (MNG) replacing the management circuit 413, and a circuit 704 (kVGS) for managing the level of the control voltage applied to the transistor 150 replacing the management circuit 416 and the circuit 408. The control unit 702 does not comprise neither the comparison circuit 411, nor the generation circuit 412 of the voltage RegVthoff4. Thus, in this embodiment, the voltage VDS4 is compared to the constant reference value Vref_Vthoff5 set in relation with FIG. 6.

In addition, the comparison circuit 410 receives, as an input, the voltage VDS4, and delivers, as an output, a comparison voltage VComp1. The comparison circuit 410 is configured to compare the value of the magnitude of the voltage VDS4 to a threshold voltage VTHOFF-N(VDS4). This comparison circuit allows the voltage N(VDS4) to be generated, and the opening of the transistor 150 to be forced in the case of a decreasing of the duration of the conduction cycle of the transistor 150, which may occur when the voltage Vtdn4 is not generated.

According to an embodiment, the management circuit 704 receives, as an input, the voltage N(VGPLL4), and delivers, as an output, a control voltage CMD_kVGS4 of the level of the control voltage of the transistor 150. In addition, and unlike the embodiment of FIG. 4, the management circuit 704 is not optional in the device 700.

As described in relation with FIGS. 4 and 5, the management circuit 704 allows a control to be delivered to the driving circuit 401 so that it reduces the level of the control voltage VGS4 of the transistor 150 during the end of the conduction cycle and, more particularly, so that it is reduced up to a second value kVGS4 nearest to the threshold voltage of the transistor 150. However, the management circuit 704 and the circuit 415 further allow information to be sent to the driving circuit so that it controls the level of the second value kVGS4 so that it is as close as possible to the threshold voltage Vth of the transistor 150. The value of the second value kVGS4 depends on the value of the current flowing through the transistor 150. The more the value of the current decreases, the more the value kVGS4 approaches the threshold voltage Vth of the transistor 150, and vice versa. The operation of the management circuit 704 will be described in relation with FIG. 8, and an example embodiment of the circuit 704 will be described in relation with FIG. 9.

Figure 8:
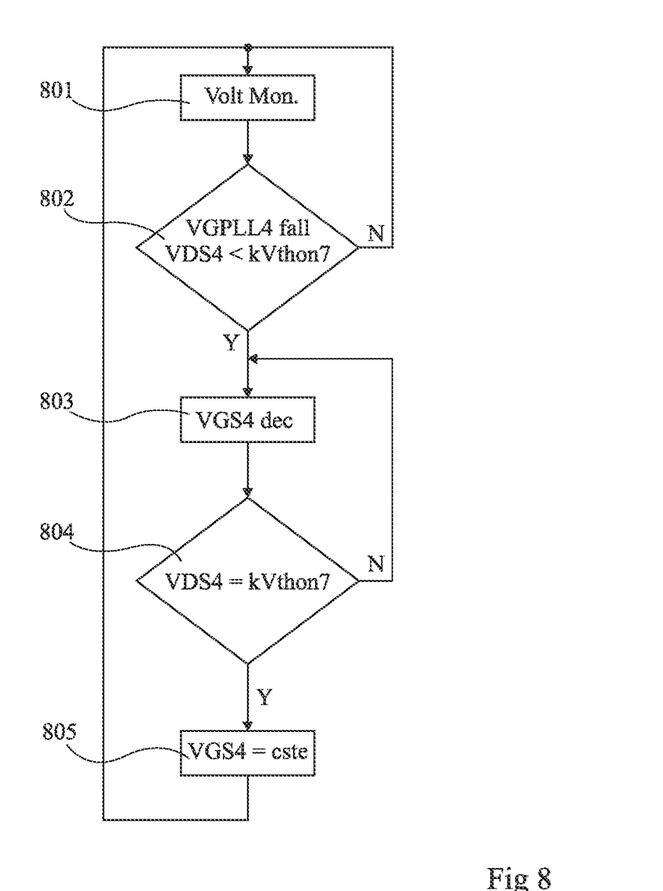
FIG. 8 illustrates a block diagram representing a method for implementing the embodiment of FIG. 7.

FIG. 8 is a block diagram representing the method of operation of the circuit 704 described in relation with FIG. 7.

As described in relation with FIG. 6, during the end of the conduction cycle of the transistor 150, the control voltage VGS4 can be decreased to approach the threshold voltage Vth of the transistor 150.

At a first step 801 (Volt Mon.), the conduction cycle of the transistor 150 is in progress and the voltages VDS4, VGS, and VGPLL are monitored.

At a step 802 (VGPLL4 Fall VDS4<kVthon7), the voltage VGPLL presents a decreasing edge, and the voltage VDS4 is smaller (in absolute value) than a threshold voltage kVthon7. As long as these two requisites are not met (output N of the block at step 802) the next step is the step 801, otherwise the next step is a step 803 (VGS4 dec.).

According to an embodiment, the threshold voltage kVthon7 is set as the result of the multiplication of a factor k by the threshold voltage VTHON4 representing the threshold the voltage VDS4 exceeds when the parasitic diode 151 begins conducting. The factor k is chosen such a way that the control voltage VGS4 is smaller than the maximum voltage VGS4, but greater than the threshold voltage Vth of the transistor 150, and such a way that the current ISD4 keeps flowing through the transistor 150, and thus allowing the conduction of the parasitic diode 151 to be avoided. According to an example, the factor is comprised between one third and two third.

At the step 803, the control voltage VGS4 is reduced, and the voltage VGS4 is still monitored. As long as the control voltage VGS4 is not equal to the threshold voltage kVthon7, the voltage VGS4 keeps decreasing.

At a step 804 (VDS4=kVthon7), the voltage VDS4 is greater than or equal to the threshold voltage kVthon7, and the next step (output Y of the block of step 804) is a step 805 (VGS4=cste) during which the voltage VGS4 is maintained constant, and then voltage VDS4 begins decreasing (in absolute value). As previously mentioned, as long as the voltage VDS4 is not equal to the threshold voltage kVthon7 (output N of the block of step 804), the voltage VGS4 keeps decreasing.

An advantage of this embodiment is that decreasing the control voltage VGS4 as approaching the end of the conduction cycle of the transistor 150 allows the leakages of the recovery current to be restrained, and sometimes be avoided, during the short period of conduction of the parasitic diode 151 of the transistor 150.

Figure 9:
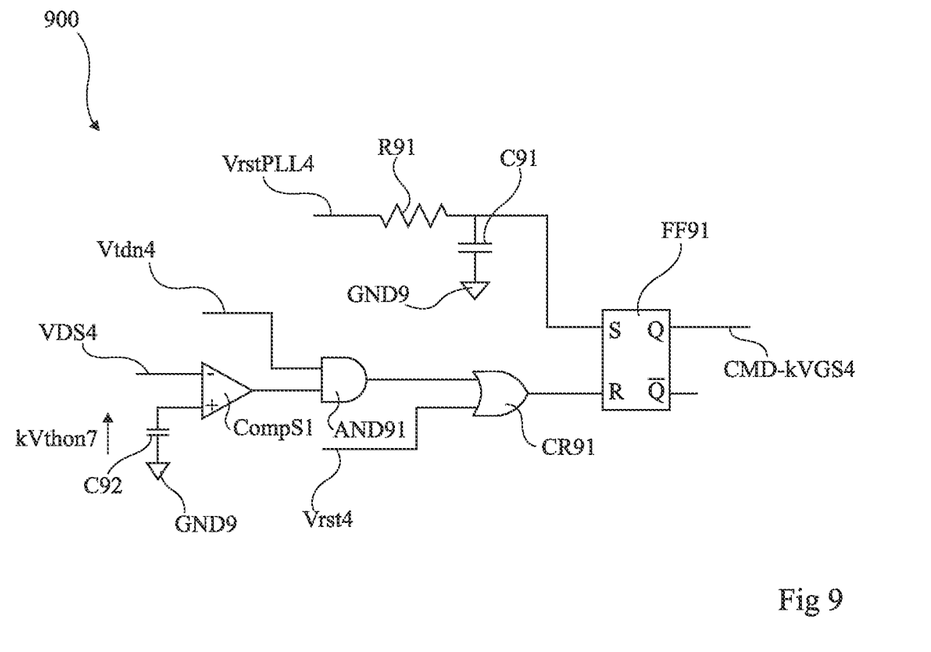
FIG. 9 schematically illustrates an example implementation of a part of the embodiment of FIG. 7.

FIG. 9 illustrates a circuit 900 representing an example embodiment of the circuit 704 described in relation with FIG. 7, implemented according to the operation described in relation with FIG. 8.

As described in relation with FIG. 7, the circuit 900 receives, as an input, the voltages VDS4, VrstPLL4, Vrst4, and delivers, as an output, the control voltage CMD_kVGS4. In addition, the circuit 500 receives the control voltage Vtdn4 described in relation with FIG. 5, and the threshold voltage kVthon7.

The circuit 900 comprises a flip-flop FF91 delivering, as an output, the control voltage CMD_kVGS4. The flip-flop FF91 comprises a control input S, a reset input R, a non-inverting output Q, delivering the control voltage CMD_kVGS4, and an inverting output NQ.

The circuit 900 further comprises a resistor R91 and a capacitor C91. The resistor R91 receives on a first terminal the voltage VrstPLL4, and has its second terminal coupled, preferably connected, to the control input S of the flip-flop FF91. The capacitor C91 comprises a first terminal coupled, preferably connected, to a reference node GND9 receiving a reference potential, for example the ground, and a second terminal coupled, preferably connected, to the control input S of the flip-flop FF91.

The circuit 900 further and lastly comprises a comparator circuit Comp91, a capacitor C92, an AND logic gate AND91, and an OR logic gate OR91. The comparator circuit Comp91 comprises an inverting input receiving the voltage VDS4, and a non-inverting input receiving the threshold voltage kVthon7. The threshold voltage kVthon7 is set by the voltage across the terminals of the capacitor C92. A first terminal of the capacitor C92 is coupled, preferably connected, to the non-inverting input of the comparator circuit Comp91, and a second terminal of the capacitor C92 is coupled, preferably connected, to the reference node GND9. The AND logic gate AND91 comprises a first terminal receiving the voltage Vtdn4, and a second input coupled to the output of the comparator circuit Comp91. The OR logic gate OR91 comprises a first input receiving the voltage Vrst4, and a second input coupled to the output of the AND logic gate AND91. The output of the OR gate OR91 is coupled to the reset terminal R of the flip-flop FF91.

Figure 10:
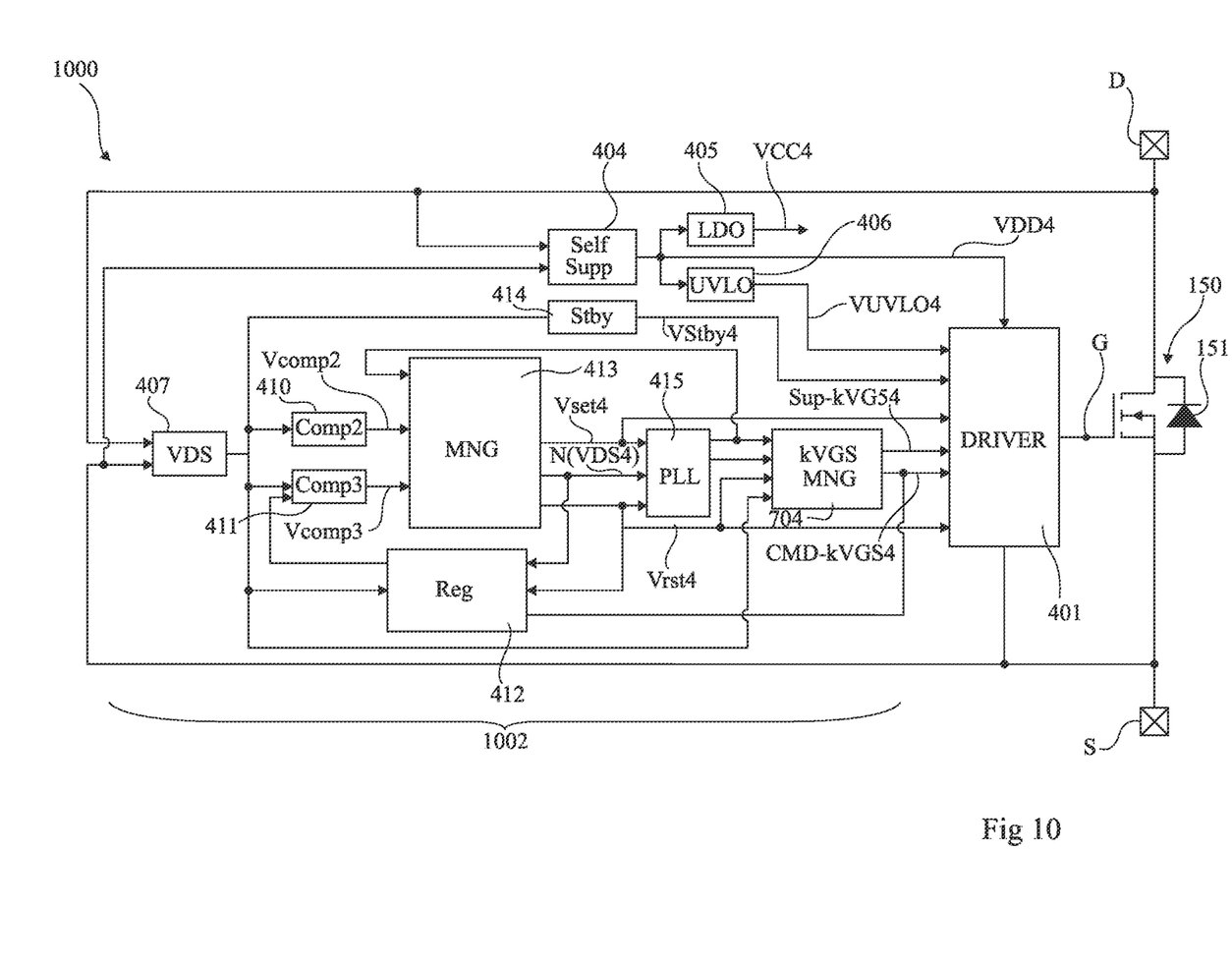
FIG. 10 illustrates, schematically and in a block form, a more detailed third embodiment of a control circuit of a transistor.

FIG. 10 illustrates more precisely and in a block form a third embodiment of a device of the type of the device of FIG. 1. More particularly, FIG. 10 illustrates a third embodiment of an electronic device comprising the transistor 150 and the control circuit 1000 thereof.

This embodiment illustrates the combination of the embodiments of FIGS. 4 and 7. In other words, the control circuit 1000 implements the functionalities of the control circuit 400 of FIG. 4 and of the control circuit 700 of FIG. 7. Thus, the control circuit 1000 presents elements in common with the circuits 400 and 700. These elements will not be again described and only the differences between the circuit 1000 and the circuits 400 and 700 will be detailed.

In particular, the control circuit 1000 comprises, like the circuits 400 and 700, the driving circuit 401 (DRIVER) delivering the control voltage VGS4 to the transistor 150. To this end, the driving circuit 401 is coupled, preferably connected, to the terminals G and S of the transistor 150. In addition, the driving circuit 401 receives a supply voltage VDD4, and several control voltages hereinafter detailed.

The control circuit 1000 further comprises other circuits all constituting parts of a control unit 1002 of the type of the control units 101, 402, or 702.

Like the control unit 402 of FIG. 4, and the control unit 702 of FIG. 7, the control unit 1002 comprises: the supply circuits constituted by the circuits 404 (Self Supp), 405 (LDO), and 406 (UVLO), the circuit 405 delivering the supply voltage VCC4 supplying all the circuits of the control unit 702 and the driving circuit 401; the measurement circuit 407 (VDS) of the drain-source voltage of the transistor 150; the comparison circuits 410 (Comp2) and 411 (comp3); the stand-by circuit 414 (Stby); and the time period regulation circuit 415 (PLL).

Like the control unit 402, the control unit 1002 comprises the circuit 412 for generating the voltage Reg_Vthoff4. According to a non-illustrated alternative, the control unit 1002 could further comprise the comparison circuit 411 (Comp3) described in relation with FIG. 4.

Like the control unit 702, the control unit 1002 comprises the management circuit 703 (MNG), and the circuit 704 (kVGS MNG) for managing the level of the control voltage applied to the transistor 150 replacing the management circuit 416.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A method for controlling an N-channel MOS transistor, comprising:
   comparing a first voltage between a drain and a source of the N-channel MOS transistor to a second controllable threshold voltage and a third voltage;
   when the first voltage is smaller than the third voltage, applying a fourth control voltage between a gate and the source of the N-channel MOS transistor at a level that is greater than a fifth threshold voltage of the N-channel MOS transistor; and
   when the first voltage is greater than the second controllable threshold voltage, applying the fourth control voltage between the gate and the source of the N-channel MOS transistor at a level that is smaller than the fifth threshold voltage of said transistor;
   wherein said second controllable threshold voltage is equal to a first constant value between a first time and a second time; and is equal to a second variable value between the second time and a third time;
   said second variable value being equal to a sum of the first voltage and a sixth positive voltage; and
   wherein the third time corresponds to a time when the first voltage inverts.

2. The method according to claim 1, wherein the first constant value is about 0 V.

3. The method according to claim 1, wherein a first duration comprised between the first time and the second time is a constant duration corresponding to one third of a second duration, said second duration corresponding to one third of a whole duration of a conduction cycle of the N-channel MOS transistor.

4. The method according to claim 1, further comprising:
   before a fourth time comprised between the first time and the third time, applying the fourth control voltage at a third value greater than the fifth threshold voltage of said transistor; and
   between the fourth time and the third time, applying the fourth control voltage reduced up to a fourth value.

5. The method according to claim 4, wherein, between the fourth time and the third time, the fourth value is reached when the first voltage is equal to a seventh voltage.

6. The method according to claim 5, wherein the seventh voltage is equal to a multiplication of a factor by the third voltage representing a voltage level between the drain and source terminals of the N-channel MOS transistor that is reached when a parasitic diode of the N-channel MOS transistor is conductive.

7. The method according to claim 6, wherein said factor comprises between one third and two thirds.

8. The method according to claim 4, wherein the fourth time is between the second time and the third time.

9. A control circuit configured to implement the method according to claim 1.

10. An electronic device comprising a control circuit according to claim 9.

11. The device according to claim 10, further comprising said N-channel MOS transistor, and a driving circuit of said N-channel MOS transistor.

12. A device for converting a voltage comprising the device according to claim 10.

13. The device according to claim 12, being a transformer switched converter.

14. The device according to claim 12, being a converter of the up converter type.

15. The device according to claim 12, being a Buck type converter.

16. A method for controlling an N-channel MOS transistor, comprising:
   comparing a drain to source voltage of the N-channel MOS transistor to a first threshold voltage, wherein said first threshold voltage corresponds to inversion of the drain to source voltage;
   comparing the drain to source voltage of the N-channel MOS transistor to a second threshold voltage, wherein said second threshold voltage is representative of a voltage level between drain and source terminals of the N-channel MOS transistor where a parasitic diode of the N-MOS transistor becomes conductive; and
   applying a control voltage to a gate of the N-channel MOS transistor;
   wherein said control voltage is greater than a threshold voltage of the N-channel MOS transistor when the drain to source voltage is smaller than the second threshold voltage;
   wherein said control voltage is smaller than the threshold voltage of the N-channel MOS transistor when the drain to source voltage is greater than the first threshold voltage;
   wherein said first threshold voltage is equal to a first constant value between a first time and a second time and is equal to a second variable value between the second time and a third time; and
   wherein the third time corresponds to a time when the drain to source voltage inverts.

17. The method according to claim 16, wherein the second variable value is equal to a sum of the drain to source voltage and a positive voltage.

18. The method according to claim 16, further comprising before a fourth time comprised between the first time and the third time, applying the control voltage at a value greater than the threshold voltage of the N-channel MOS transistor.

19. The method according to claim 18, further comprising between the fourth time and the third time, reducing the control voltage.

20. A control circuit configured to implement the method according to claim 16.

21. An electronic device comprising a control circuit according to claim 20.

* * * * *